Figure 1:
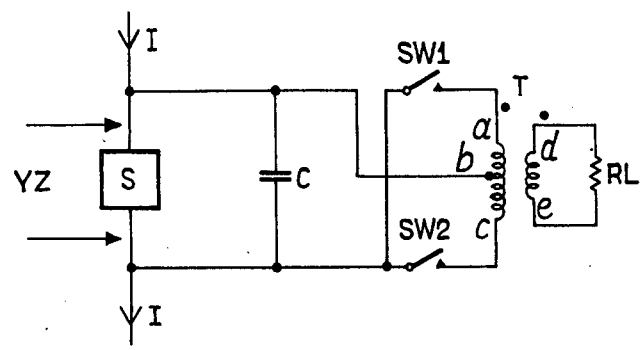

United States Patent [19]

Larner

[11] 4,028,559

[45] June 7, 1977

[54] REGENERATIVE REPEATER CIRCUIT ARRANGEMENT FOR USE IN DIGITAL DATA TRANSMISSION SYSTEMS

[75] Inventor: Douglas Stanley Larner, Maidenhead, England

[73] Assignee: Plessey Handel und Investments A.G., Switzerland

[22] Filed: Jan. 9, 1976

[21] Appl. No.: 647,733

[30] Foreign Application Priority Data

Jan. 10, 1975 United Kingdom ............... 1047/75

[52] U.S. Cl. .............................. 307/246; 307/282; 328/65
[51] Int. Cl.$^2$ ..................................... H03K 17/64
[58] Field of Search ............ 328/65, 164; 307/246, 307/282

[56] References Cited

UNITED STATES PATENTS

| | | | |
|---|---|---|---|
| 2,759,047 | 8/1956 | Meacham | 328/164 X |
| 2,983,860 | 5/1961 | Todd | 307/282 X |
| 3,070,710 | 12/1962 | Zarleng | 307/282 |
| 3,337,753 | 8/1967 | Muskovac | 307/282 X |
| 3,798,608 | 3/1974 | Huebner | 307/282 X |

Primary Examiner—John S. Heyman
Attorney, Agent, or Firm—Fleit & Jacobson

[57] ABSTRACT

Bipolar digital repeaters are commonly fed with a constant d.c. supply but with the known circuit, the mode of use of transformer-coupled output stage places a limitation on the voltage-amplitude of the output pulses. The 120 M bit/s data transmission system may occasionally require to have its repeaters operate over line-sections of exceptionally high attenuation. The proposed circuit is intended to meet these requirements, using modified connections to the transformer (3 equal windings) and minimal additional components, the maximum peak-output voltage is consequently doubled with no increase in the constant current supply. The new technique, involving a serial connection, ensures that all of the supply current becomes available for the means current in pulses of each polarity separately instead of the two polarities together.

3 Claims, 2 Drawing Figures

REGENERATIVE REPEATER CIRCUIT ARRANGEMENT FOR USE IN DIGITAL DATA TRANSMISSION SYSTEMS

The present invention relates to digital data transmission systems and is more particularly concerned with so-called unattended regenerative repeaters used in such systems.

The transmitted data in digital data transmission systems is regenerated at period intervals during the transmission of the data over the transmission line. Typically the regenerative repeater units may be separated by two kilometers and each unattended unit is arranged to be line-powered In such an arrangement transmitting or receiving terminals of the line transmission system provide series constant current power to the dependent regenerative repeater units. Accordingly the power available in each unit for regenerating the digital data to be transmitted is dictated by the power supplied by the terminal. Typically, for safety precaution purposes, it has been standardised that a constant current of 50 milliamps will be used in line transmission systems of this type.

From an economical design point of view it is arranged that a standard design is used for each regenerative repeater unit and accordingly the regenerative repeaters are designed to provide sufficient output voltage swing to drive the data to be transmitted over the transmission line sections separating a pair of repeater units. Typically the regenerator unit circuits are segregated into sub-units and each sub-unit is provided with its own individual shunt voltage stabiliser circuit all of which are connected in series and fed from the constant current power feed. In such circumstances the output stage of the regenerative repeater, being provided with its own shunt stabiliser, may use substantially all the supply current for the generation of each pulse of the transmitted bipolar pulse waveform.

The peak output voltage of the pulses may be enhanced by using so-called half-width pulse generating techniques where the output pulse is generated for only half of each bit period and a resevoir capacitor is provided to deliver a current in excess of that provided by the constant power feed.

It will be recalled that the regenerative repeaters are designed to function with line sections of the order of two kilometers. However, in certain circumstances, the repeaters may be called-upon to operated over line sections of exceptionall high attenuation. Such a situation may occur when it is impossible to site two successive repeaters at the nominal two kilometers spacing due to geographical considerations.

Accordingly there is a requirement for an output circuit which is capable of generating pulses having larger peak amplitudes. Such requirements may be met by using switch-type d.c. to d.c. converters. However, these are both complex and unreliable and are therefore generally unsuitable for use in unattended repeater stations.

It is an object of the present invention to provide a simple modification to a transformer-coupled bipolar output stage for use in a digital data transmission regenerative repeater which enables up to double the previous maximum peak output voltage to be obtained.

According to the present invention there is provided a transformer-coupled bipolar pulse generating output stage for use in a digital data line transmission regenerative repeater generating half-width output pulses and which powered by a line-powered constant current power feed, the output stage including an output transformer having two primary windings and a line driving secondary winding, the primary windings being electrically isolated from each other but magnetically coupled and each primary winding is included in an output pulse generator circuit comprising a pulse generating switching device connected in series with a primary winding and each output pulse generating circuit is provided with its own individual shunt stabiliser and reservoir capacitor and the output pulse generating circuits are supplied in series by the constant current power feed.

Figure 2:
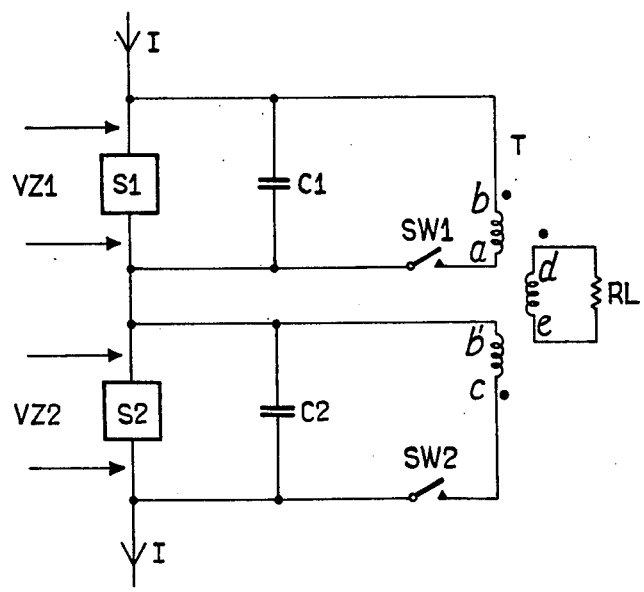

The invention will be understood from the following description which should be read in conjunction with the accompanying drawings. Of the drawings:

FIG. 1 shows a simplified diagram of a functional output stage according to the prior art and FIG. 2 shows a simplified diagram of an output stage according to one embodiment of the invention.

Referring to FIG. 1 firstly a typical prior art repeater output stage will be considered. The switching device SW1 and SW2 represent output pulse generating transistors with say switch SW1 generating positive pulses and switch SW2 generating negative pulses by way of the ideal output transformer T which drives the line section represented by load resistor RL. The output circuit is provided with a shunt stabiliser S, which may typically be a zener diode, which is bridged by a reservoir capacitor C.

The reservoir capacitor C supplies current to supplement the power feed constant current I while either of the pulse generating switches are closed and it is recharged during the half-width periods when neither of the switches are operated. If the pulse repetition frequency is fo, then the period between pulses is $To = 1/fo$. In addition, if the pulses are of width T, and the output transformer is ideal with windings ab, bc and dc of equal number of turns then, since the mean current drawn by the stage cannot exceed I, the maximum peak pulse amplitude is obtained when MEAN CURRENT THROUGH SW1 + MEAN CURRENT THROUGH SW2 = I i.e., when $$\tfrac{1}{2}\left(\frac{Tl}{To}\right)I + \tfrac{1}{2}\left(\frac{Tl}{To}\right)I = I$$

Whence $$\hat{V}_{max} = \left(\frac{To}{Tl}\right)I \cdot RL$$

Capacitor C acts as a charge reservoir and supplies a current $((T0)/(T1))$ I driving switch closure.

The pulses are produced by appropriate closures of the switches SW1 and SW2 according to the desired duration and polarity of the output pulses.

As mentioned previously the voltage drop across the output stage is stabilised by the shunt stabiliser S and limiting case VZ will equal $\hat{V}$max. Taking typical examples; if the load resistor RL is 100 ohms and the constant current supply is 50 milliamps, the output voltage peak swing will be 10 volts with capacitor C providing a supplementary 50 milliamps while either of the switches are closed. Capacitor C will be recharged in each half bit period when neither of the switches is operated.

The maximum output voltage obtainable from an output stage may be doubled for the same power feed current I by using the techniques of the invention and this arrangement is shown in FIG. 2.

Here, the transformer primary winding has been split into parts $a$, $b$ and $b'c$ which are electrically insulated but magnetically coupled as before, both to one another and to the secondary winding d.e. Two shunt stabiliser $S_1$, and $S_2$ and two resevoir capacitors, $C_1$ and $C_2$, are now employed with $v_{z1} = V_{z2}$ for equal amplitude positive and negative output pulses as before.

With this configuration the maximum peak output voltage becomes 2 Vmax since the mean current through either switch may now equal I instead of only half the value in the FIG. 1 case. The total voltage drop across the stage is the 4 Vmax, but the power feed current, I, remains unchanged.

The circuit of FIG. 2 is well adapted to the use of an output transformer wound with trifilar wire giving the same number of turns of each of the three windings. Such transformers are commonly employed where fast rising pulses are to be transmitted.

In a practical realisation, the switches SW1 and SW2 may be transistors which are switched between the cut-off and saturated conditions by pulses of short duration compared to $t_1$. The mean current required to do this must be subtracted from the available power feed current I in determining the maximum output voltage obtainable from the circuit. Losses within the transformer and the non-ideal characteristics of transistors as switches will also reduce the available output voltage but do not affect the principle of operation of the circuit.

If similar component values as used in FIG. 1 are applied to FIG. 2 it will be seen that a 20 volt max peak swing may be generated across the primary windings $ab$ or $b'c$ with the additional current being provided from the relevant reservoir capacitor C1 or C2. The provision of discrete stabilisation/resevoir capacitors for each "half" of the output stage permits the reservoir capacitors to recharge not only during the half bit period during which both SW1 and SW2 are open but also during the complete bit period while the other switch is generating a half-width pulse.

Such an arrangement is particularly suited for use in so-called ternary transmission systems using discrepancy coding. Such a system of coding "strives" to equalise the number of +1 and −1 pulses transmitted during a message transmission. Accordingly in such a transmission system the reservoir capacitor on average will be called upon to supply 3I for half a bit period every other bit period.

What we claim is:

1. A transformer-coupled bi-polar pulse generating output stage for use in a digital data line transmission regenerative repeater generating half-width output pulses from a line-powered constant current power feed, said output stage comprising;
   an output transformer having two primary windings and a secondary winding, the secondary winding connecting the output stage to the digital data line,
   a pair of pulse generating switching device means for generating bi-polar pulses, each switching device means connected in series with a separate one of said primary windings,
   a pair of reservoir capacitors, each reservoir capacitor connected in parallel with a separate primary winding and switching device means series circuit,
   means for connecting each of said reservoir capacitors in series so that the reservoir capacitors are charged in series by the constant current power feed, and
   means for stabilising a voltage drop across each primary winding and switching device means series circuit, comprising a pair of shunt stabiliser devices each connected in parallel with a separate reservoir capacitor.

2. The invention of claim 1 wherein each of said switching device means comprises a transistor.

3. The invention of claim 1 wherein each of said shunt stabiliser devices comprises a zener diode.

* * * * *